United States Patent
Hama (10) Patent No.: US 8,570,822 B2
(45) Date of Patent: Oct. 29, 2013

(54) SEMICONDUCTOR MEMORY AND SEMICONDUCTOR MEMORY TEST METHOD

(75) Inventor: Kaoru Hama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 325 days.

(21) Appl. No.: 12/978,775

(22) Filed: Dec. 27, 2010

(65) Prior Publication Data

US 2011/0228612 A1 Sep. 22, 2011

(30) Foreign Application Priority Data

Mar. 18, 2010 (JP) .................................. 2010-063020

(51) Int. Cl.
*G11C 7/00* (2006.01)

(52) U.S. Cl.
USPC ........................ 365/201; 365/200; 365/185.09

(58) Field of Classification Search
USPC ..................................... 365/201, 200, 185.09
See application file for complete search history.

(56) References Cited

U.S. PATENT DOCUMENTS

| | | | |
|---|---|---|---|
| 6,249,468 B1 * | 6/2001 | Kan et al. ....................... | 365/201 |
| 2003/0198112 A1 * | 10/2003 | Eleyan et al. ................. | 365/205 |
| 2005/0135167 A1 * | 6/2005 | Manabe ........................ | 365/201 |
| 2009/0316495 A1 * | 12/2009 | Inaba et al. ............... | 365/189.05 |

FOREIGN PATENT DOCUMENTS

| | | |
|---|---|---|
| JP | 2000-251499 | 9/2000 |
| JP | 2005-071481 | 3/2005 |

* cited by examiner

*Primary Examiner* — Vu Le
*Assistant Examiner* — Han Yang
(74) *Attorney, Agent, or Firm* — White & Case LLP (57) ABSTRACT

According to the embodiments, a read circuit is connected to the other end of the bit line for reading out data from read data storing memory cells and test data storing memory cells via the bit line, and a read control circuit makes data to be read out from the test data storing memory cells when testing the bit line and makes data to be read out from the read data storing memory cells when reading out the read data.

7 Claims, 7 Drawing Sheets

SEMICONDUCTOR MEMORY AND SEMICONDUCTOR MEMORY TEST METHOD

CROSS-REFERENCE TO RELATED APPLICATIONS

This application is based upon and claims the benefit of priority from the prior Japanese Patent Application No. 2010-63020, filed on Mar. 18, 2010; the entire contents of which are incorporated herein by reference.

FIELD

Embodiments described herein relate generally to a semiconductor memory and a semiconductor memory test method.

BACKGROUND

In conventional semiconductor memories, it has been necessary to read/write data from/to a memory cell in order to test an open failure of a bit line and a short failure of adjacent bit lines, and, therefore the test has been troublesome.

Also, JP-A-2000-251499, for example, discloses a method of providing a first register formed of a plurality of flip-flops connected to one ends of bit lines and a second register formed of a plurality of flip-flops connected to the other ends of the bit lines for disconnection test of each of bit liens in order to determine presence/absence of disconnection of each of the bit lines in a memory cell array and comparing test data that are written into the first register, transferred to the second register via the bit lines, and read out from the second register with the test data written into the first register.

DETAILED DESCRIPTION

In general, according to the present embodiments, a read data storing memory cell array, a read data word line, a bit line, a test data storing memory cell array, a test data word line, a read circuit, a row decoder, and a read control circuit are provided. The read data storing memory cell array is provided with read data storing memory cells arranged in matrix for storing the read data. The read data word line is connected commonly to the data storing memory cells for each of rows. The bit line is commonly connected to the read data storing memory cells for each of column. The test data storing memory cell array is provided with test data storing memory cells arranged in matrix and connected to one ends of the bit lines. The test data word line is connected commonly to the test data storing memory cells of each of rows. The read circuit is connected to the other ends of the bit lines and reads out data from the read data storing memory cells and the test data storing memory cells via the bit lines. The row decoder selects the test data storing memory cells in a row direction via the test data word line and selects the read data storing memory cells in the row direction via the read data word line. The read control circuit makes data to be read out from the test data storing memory cells when testing the bit lines and makes data to be read out from the read data storing memory cells when reading out the read data.

Exemplary embodiments of a semiconductor memory and a semiconductor memory test method will be explained below in detail with reference to the accompanying drawings. The present invention is not limited to the following embodiments.

(First Embodiment)

Figure 1:
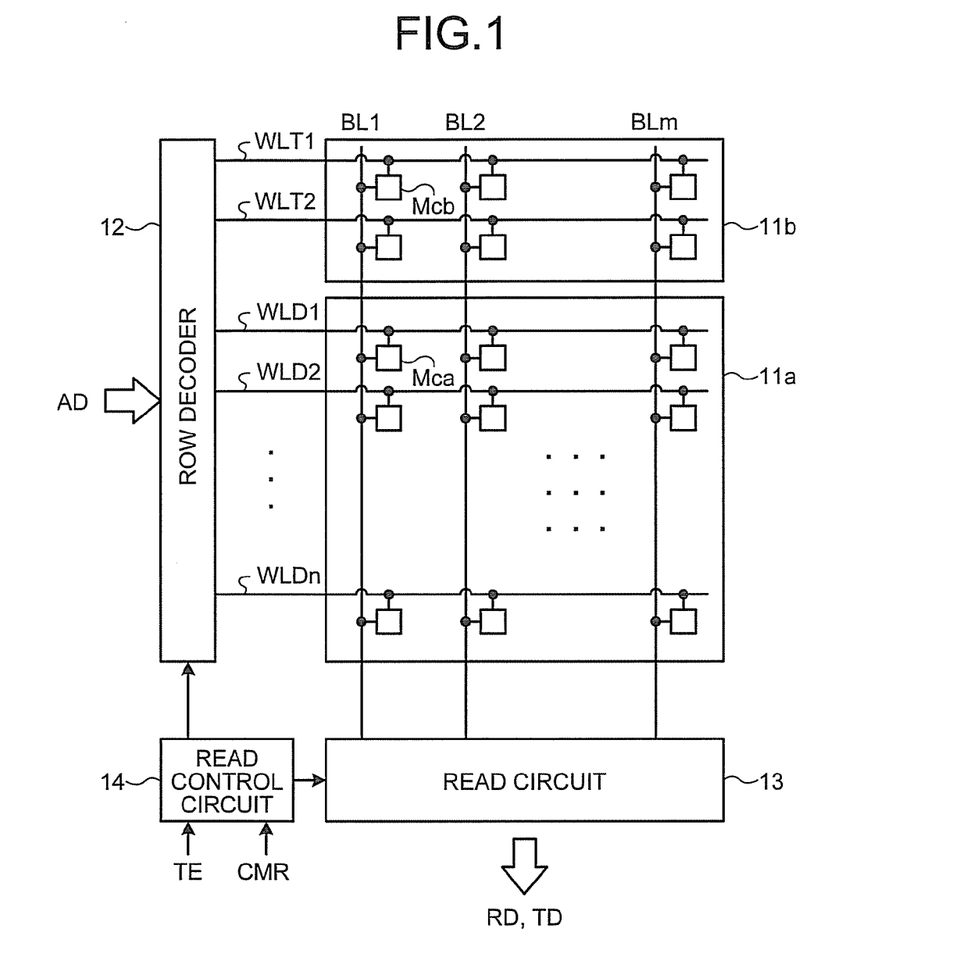
FIG. 1 is a block diagram illustrating a schematic configuration of a semiconductor memory according to a first embodiment of the present invention.

FIG. 1 is a block diagram illustrating a schematic configuration of a semiconductor memory according to the first embodiment of the present invention. The embodiment is one example of adapting the present invention to a ROM (read only memory).

Referring to FIG. 1, the semiconductor memory is provided with a read data storing memory cell array 11a and a test data storing memory cell array 11b. In the read data storing memory cell array 11a, read data storing memory cells MCa for storing read data RD are arranged in a matrix. In the test data storing memory cell array 11b, test data storing memory cells MCb for storing test data TD are arranged in matrix. The read data storing memory cells MCa and the test data storing memory cells MCb can form a mask ROM that is not rewritable, for example.

The test data storing memory cell array 11b is connected to one ends of bit lines BL1 to BLm (m is a positive integer). The test data storing memory cells MCb are provided for two rows, and it is preferable that "0" and "1" are alternately stored in the test data storing memory cells MCb of one row and the test data storing memory cells MCb of one column store data that are different from each other. For example, the test data storing memory cells MCb of the first line may store the test data TD of "0101010 . . . " in this order, and the test data storing memory cells MCb of the second line may store the test data TD of "1010101 . . . " in this order.

The above-described constitution is appropriate for a memory device having a mode for simultaneously activating (performing read operation of) all of the columns. In a memory performing selective column activation operation, it is possible to test all-bit-0 data which have a potential inverted to that of a precharge of the bit lines BL1 to BLm.

The read data storing memory cells MCa of one row are commonly connected via one of read data word lines WLD1 to WLDn (n is a positive integer). The test data storing memory cells MCb of one row are commonly connected via a test data word line WLT1 or WLT2. The read data storing memory cells MCa and the test data string memory cell MCb of one column are commonly connected via one of the bit lines BL1 to BLm.

The semiconductor memory is provided with a row decoder 12, a read circuit 13, and a read control circuit 14. The row decoder 12 is connected to one ends of the read data word lines WLD1 to WLDn and the test data word lines WLT1 and WLT2. The row decoder 12 selects the test data storing memory cells MCb in a row direction via the test data word lines WLT1 and WLT2 and selects the read data storing memory cells MCa in the row direction via the read data word lines WLD1 to WLDn designated by an address AD.

The read circuit 13 is connected to the other ends of the bit lines BL1 to BLm. The read circuit 13 reads out the read data RD from the read data storing memory cells MCa and reads out the test data TD from the test data storing memory cells MCb via the bit lines BL1 to BLm.

The read control circuit 14 makes the test data TD to be read out from the test data storing memory cells MCb when testing the bit lines BL1 to BLm and makes the read data RD to be read out from the read data storing memory cells MCa when reading out the read data. As the test of the bit lines BL1 to BLm, an open test of the bit lines BL1 to BLm and a short test of the bit lines BL1 to BLm may be performed.

In the test of the bit lines BL1 to BLm, a test command TE and a read command CMR are inputted to the read control circuit 14. Upon input of the test command TE and the read command CMR to the read control circuit 14, an instruction of selecting the test data storing memory cells MCb is given from the read control circuit 14 to the row decoder 12, and the test data storing memory cells MCb are selected by the test data word lines WLT1 and WLT2. Upon selection of the test data storing memory cells Mob, the test data TD are read out from the test data storing memory cells MCb and sent to the read circuit 13 via the bit lines BL1 to BLm, and it is determined whether the test data TD are "0" or "1".

It is possible to test the bit lines BL1 to BLm by connecting the test data storing memory cell array lib to the bit lines BL1 to BLm at the side opposite to the read circuit 13 and making the test data TD to be read out from the test data storing memory cell array 11b. Therefore, it is unnecessary to make the read data RD to be read out from the read data storing memory cell array 11a for testing the bit lines BL1 to BLm, thereby making it possible to shorten the test time while suppressing an increase in circuit size.

Since the circuit for reading out the test data TD at the other ends of the bit lines BL1 to BLm is a sense amplifier per se, not an additional circuit for the test, it is possible to reduce the circuit size as compared to the conventional technology.

In the case where the test data TD sent via the bit lines BL1 to Blm connected to the test data storing memory cells MCb are "1" though "0" is stored in the test data storing memory cells MCb, it is determined that the bit lines BL1 to BLm have the open failure. Also, in the case where the test data TD sent via the bit lines BL1 to BLm connected to a pair of test data storing memory cells MCb that are adjacent to each other in the row direction are the same though different data are stored in the pair of test data storing memory cells MCb, it is determined that the short failure occurs in the bit lines BL1 to BLm.

By storing the test data TD of "0101010 . . . " in this order in the test data storing memory cells MCb of the first line store and storing the test data storing the test data TD of "1010101 . . . " in this order in the memory cells MCb of the second line store, it is possible to make the test data storing memory cells MCb to send the test data TD of "0" to all of the bit lines BL1 to BLm as well as to make all of the adjacent bit lines BL1 to BLm to send different data.

Therefore, by connecting the test data storing memory cell array 11b to one ends of the bit lines BL1 to BLm, it is possible to perform the open failure test of all of the bit lines BL1 to BLm and the short failure test between the adjacent bit lines, thereby making it possible to shorten the test time.

Since the ordinary memory cells MCa are not made to operate during the test, it is possible to test the bit lines BL1 to BLm of the ROM irrespective of the type of a program.

Meanwhile, in the case of reading out the read data RD from the data storing memory cells MCa, the read command CMR is inputted to the read control circuit 14, and the address AD is inputted to the row decoder 12. Upon input of the read command CMR to the read control circuit 14, an instruction of selecting the read data storing memory cells MCa is given from the read control circuit 14 to the row decoder 12, and the read data storing memory cells MCa designated by the address AD are selected via the read data word lines WLD1 to WLDn. Upon selection of the read data storing memory cells MCa, the read data RD are read out from the read data storing memory cells MCa and sent to the read circuit 13 via the bit lines BL1 to BLm, and it is determined whether the read data RD are "0" or "1".

(Second Embodiment)

Figure 2:
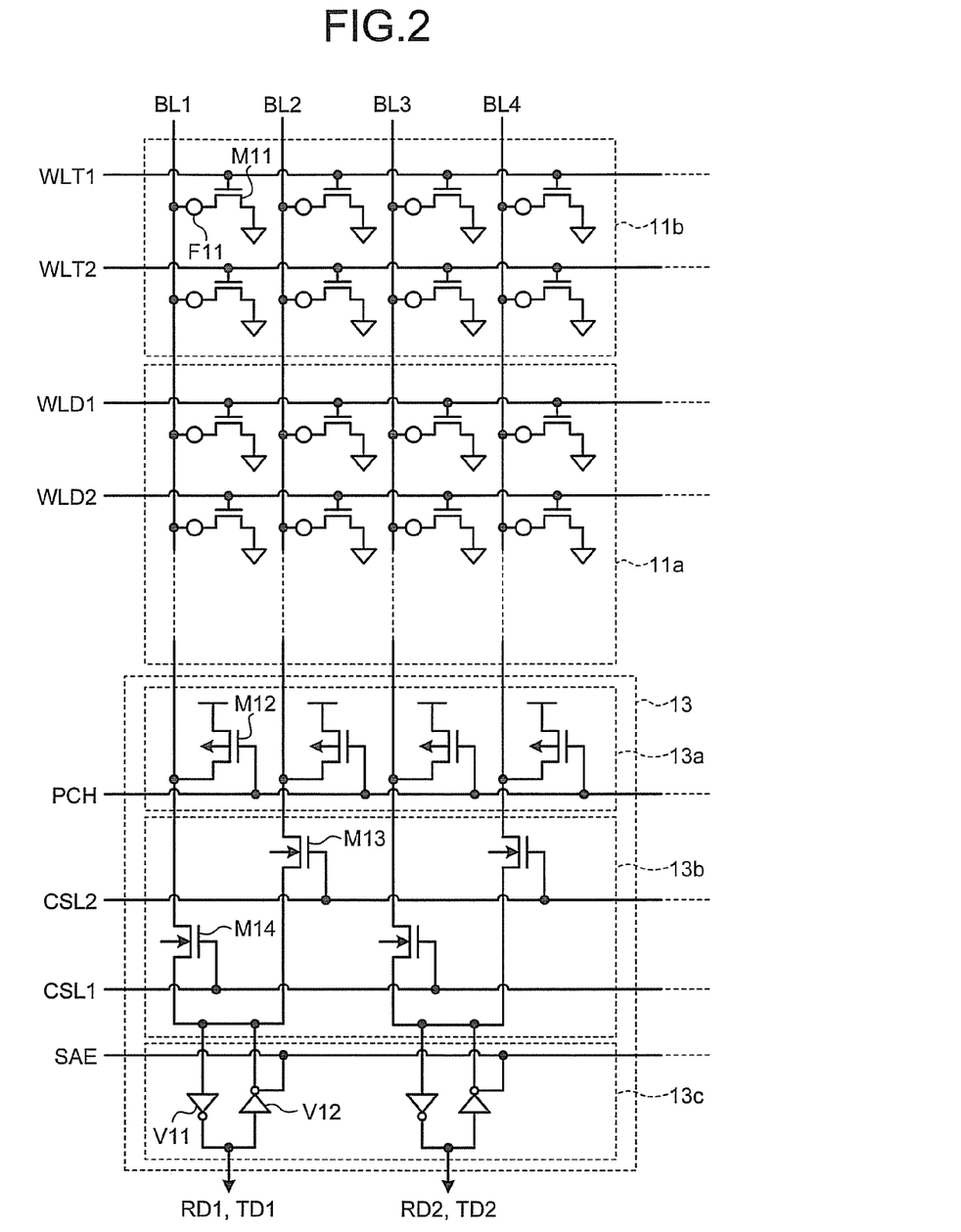
FIG. 2 is a block diagram illustrating a schematic configuration of a semiconductor memory according to a second embodiment of the present invention.

FIG. 2 is a block diagram illustrating a schematic configuration of a semiconductor memory according to the second embodiment of the present invention.

Referring to FIG. 2, in the semiconductor memory, a field effect transistor M11 and a contact area F11 are provided as the read data storing memory cell Ma and the test data storing memory cell MCb of FIG. 1. In the semiconductor memory, it is possible to express "0" and "1" of ROM data by the presence and absence of contact of the contact area F11. It is preferable to use a contact of a metal wiring layer which is disposed as close as possible to a surface as the contact area F11 in view of easiness of changing the ROM data.

In the semiconductor memory, it is possible to make the test data storing memory cells MCb of the first line to store test data TD of "11001100 . . . " in this order, and it is possible to make the test data storing memory cells MCb of the second line to store test data TD of "00110011" in this order.

Gates of the field effect transistors M11 of one row are commonly connected to one of read data word lines WLD1 to WLDn or one of test data word lines WLT1 and WLT2. Drains of the field effect transistor M11 of one column are commonly connected to one of the bit lines BL1 to BLm via the contact area F11.

A read circuit 13 is provided with a precharge circuit 13a for precharging the bit lines BL1 to BLm, a column selection circuit 13b for performing column selection, and a sense amplifier circuit 13c for detecting whether the data stored in the read data storing memory cells MCa and the test data storing memory cells MCb are "0" or "1".

In the precharge circuit 13a, a field effect transistor M12 is provided in each of the columns. A drain of the field effect transistor M12 of one column is connected to one of the bit lines BL1 to BLm. A precharge signal PCH is inputted to gates of the field effect transistors M12. As the field effect transistors M12, a P-channel field effect transistor may be used.

In the column selection circuit 13b, field effect transistors M13 and M14 are provided for each of pairs of adjacent two columns. The field effect transistors M13 are inserted into the even-numbered bit lines BL2, BL4, and the like, and the field effect transistors M14 are inserted into the odd-numbered bit lines BL1, BL3, and the like. A column selection signal CSL2 is inputted into the gates of the field effect transistors M13, and a column selection signal CSL1 is inputted to gates of the field effect transistors M14. As the field effect transistors M13 and M14, an N-channel field effect transistor may be used.

In the sense amplifier circuit 13c, inverters V11 and V12 are provided for each of pairs of adjacent two columns. An output of the inverter V11 is connected to an input of the inverter V12, and an output of the inverter V12 is connected to an input of the inverter V11, thereby forming the sense amplifier. The input of the inverter V11 and the output of the inverter V12 for adjacent two columns are connected to the bit lines BL1 to BLm. A sense amplifier enable signal SAE is inputted to the inverter V12.

For a test of the bit lines BL1 to BLm, the precharge signal PCH exhibits a low level to turn on the field effect transistors M12, and the bit lines BL1 to BLm are precharged to a high level potential.

When the column selection signal CSL1 exhibits a high level, the field effect transistors M14 are turned on to connect the odd-numbered bit lines BL1, BL3, and the like to the sense amplifier circuit 13c.

A high level potential is applied to the gates of the field effect transistors M11 via the test data word lines WLT1 and WLT2 to turn on the field effect transistors M11. When the field effect transistors M11 are turned on, the bit lines BL1, BL3, and the like are connected to a low level potential when the contact of the contact area F11 is present, and the potential of the bit lines BL1, BL3, and the like transits to a low level potential, so that "0" is read as the ROM data.

In contrast, when the contact of the contact area F11 is absent, the bit lines BL1, BL3, and the like are not connected to the low level potential even when the field effect transistors N11 are turned on, and the potential of the bit lines BL1, BL3, and the like maintains the high level potential, so that "1" is read as the ROM data.

The ROM data read out from the test data storing memory cells MCb are sent to the read circuit 13 via the bit lines BL1, BL3, and the like to make the sense amplifier enable signal SAE to exhibit a high level, and it is determined whether the test data TD is "0" or "1".

When the ROM data are sent to the read circuit 13 via the bit lines BL1, BL3, and the like, the precharge signal PCH exhibits a low level to turn on the field effect transistors M12, and the bit lines BL to BLm are precharged to the high level potential.

When the column selection signal CSL2 exhibits a high level, the field effect transistors M13 are turned on, and the even-numbered bit lines BL2, BL4, and the like are connected to the sense amplifier circuit 13c.

A high level potential is applied to the gates of the field effect transistors Nil via the test data word lines WLT1 and WLT2 to turn on the field effect transistors M11, and the ROM data are read out from the test data storing memory cells MCb. The ROM data read out from the test data storing memory cells MCb are sent to the read circuit 13 via the bit lines BL2, BL4, and the like to make the sense amplifier enable signal SAE to exhibit a high level, and it is determined whether the test data TD1 and TD2 are "0" or "1".

In the case of making the read data RD1, RD2, and the like to be read out from the data storing memory cells MCa, the precharge signal PCH exhibits a low level to turn on the field effect transistors M12, and the bit lines BL1 to BLm are precharged to a high level potential.

Also, when the column selection signals CLS1 and CSL2 exhibit a high level in response to the address AD, the field effect transistors M13 and M14 are turned on, and the bit lines BL1 to BLm are connected to the sense amplifier 13c.

The high level potential is applied to the gates of the field effect transistors M11 via the read data word lines WLD1 to WLDn to turn on the field effect transistors M11, and the ROM data are read out from the data storing memory cells MCa in response to the presence/absence of the contact of the contact area F11. The ROM data read out from the data storing memory cells MCa are sent to the read circuit 13 via the bit lines BL1 to BLm to make the sense amplifier enable signal SAE to exhibit a high level, and it is determined whether the read data RD1 and RD2 are "0" or "1".

(Third Embodiment)

Figure 3:
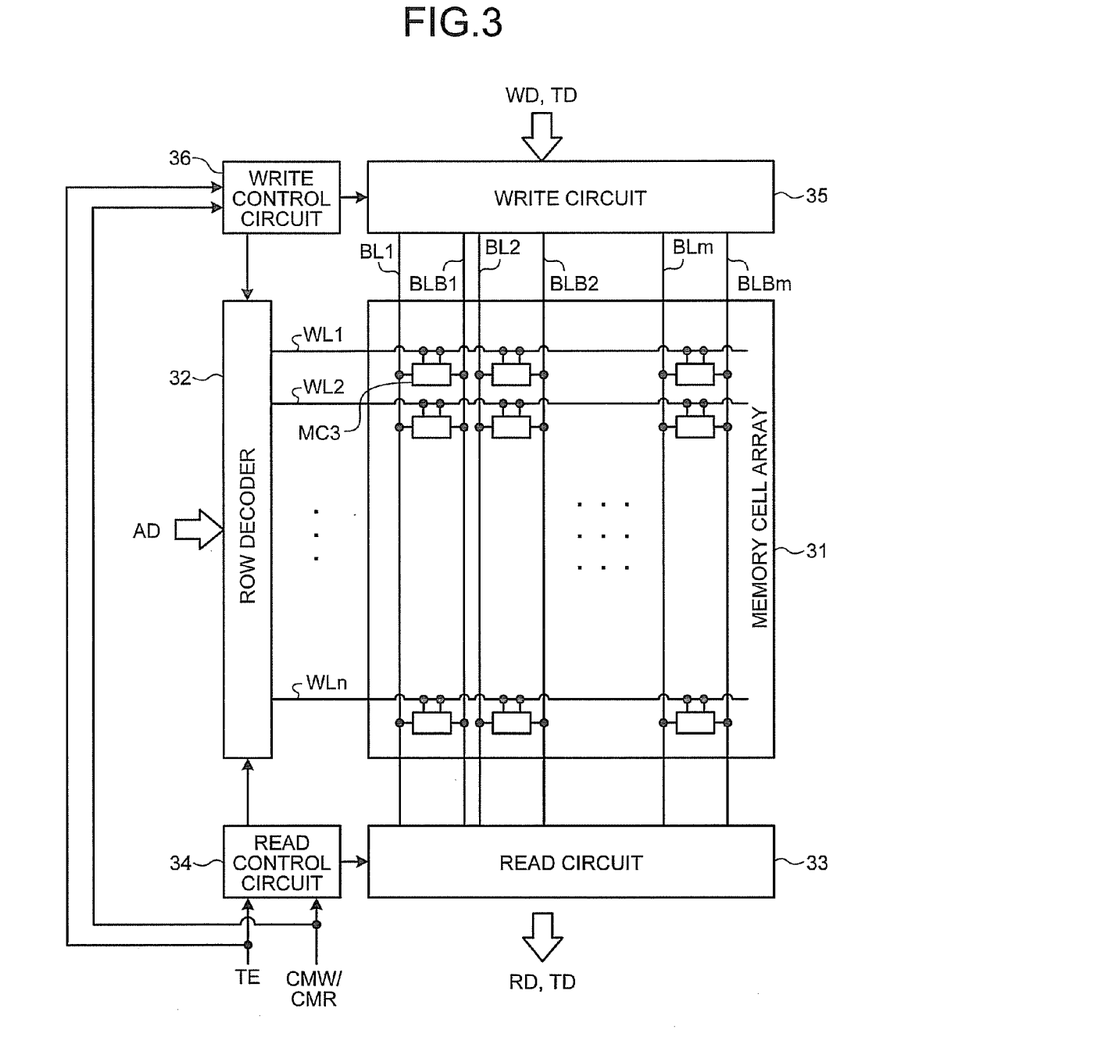
FIG. 3 is a block diagram illustrating a schematic configuration of a semiconductor memory according to a third embodiment of the present invention.

FIG. 3 is a block diagram illustrating a schematic configuration of a semiconductor memory according to the third embodiment of the present invention.

Referring to FIG. 3, the semiconductor memory is provided with a memory cell array 31, a row decoder 32, a read circuit 33, a read control circuit 34, a write circuit 35, and a write control circuit 36. In the memory cell array 31, memory cells MC3 for storing read data RD are arranged in matrix. The memory cells MC3 are capable of complementarily storing data and forming a SRAM, for example.

The memory cells MC3 of one row are commonly connected via one of word lines WL1 to WLn. The memory cells MC3 of one column are commonly connected via one of bit lines BL1 to BLm and one of BLB1 to BLBm. In the case of read/write on the memory cell MC3, the bit lines BL1 to BLm and the bit lines BLB1 to BLBm are complementarily operated. For example, "1" is read out via the bit lines BLB1 to BLBm in the case where "0" is read out via the bit lines BL1 to BLm, and "0" is read out via the bit lines BLB1 to BLBm in the case where "1" is read out via the bit lines BL1 to BLm.

The row decoder 32 is connected to one ends of the word lines WL1 to WLn. The row decoder 32 is capable of selecting the memory cells MC3 in a row direction via the word lines WL1 to WLn designated by an address AD.

The write circuit 35 is connected to one ends of the bit lines BL1 to BLm. The write circuit 35 writes write data WD on the memory cells MC3 via the bit lines BL1 to BLm and sends test data TD to the bit lines BL1 to BLm.

The write control circuit 36 makes the write circuit 35 to send the test data TD to the bit lines BL1 to BLm when testing the bit lines BL1 to BLm and makes the write circuit 35 to write the write data WD on the memory cells MC3 when writing the write data WD.

The read circuit 33 is connected to the other ends of the bit lines BL1 to BLm. The read circuit 33 can read out read data RD from the memory cells MC3 via the bit lines BL1 to BLm and read out the test data TD sent from the write circuit 35 via the bit lines BL1 to BLm.

The read control circuit 34 may make the test data TD sent from the write circuit 35 via the bit lines BL1 to BLm to be read out when testing the bit lines BL1 to BLm and make the read data RD to be read out from the memory cells MC3 when reading out the read data RD.

For the test of the bit lines BL1 to BLm, a test command TE is inputted to the read control circuit 34 and the write control circuit 36. Upon input of the test command TE to the read control circuit 34 and the write control circuit 36, the test data TD are sent from the write circuit 35 via the bit lines BL1 to BLm to be read out by the read circuit 33, and it is determined whether the test data TD are "0" or "1". For example, in the case where the test data sent from the one ends of the bit lines BL1 to BLm is "0" and the test data read out from the other ends of the bit lines BL1 to BLm are "1", it is determined that the bit lines BL1 to BLm have the open failure.

Also, in the case where the test data sent from the one ends of a pair of the adjacent bit lines among the bit lines BL1 to BLm are different from each other and the test data read out from the other ends of the pair of the bit lines are the same, it is determined that the short failure occurs in the pair of the bit lines.

Since the word lines WL1 to WLn are not activated during the test, the memory cells are not selected. When a state in which the write circuit 35 and the read circuit 33 are simultaneously operated is established, the test of the bit lines BL1 to BLm is performed.

Meanwhile, in the case of writing the write data WD to the memory cells MC3, a write command CMW is inputted to the write control circuit 36, and an address AD is inputted to the row decoder 32. Upon input of the write command CMW to the write control circuit 36, the memory cells MC3 designated by the address AD are selected via the word lines WL1 to WLn. Upon selection of the memory cells MC3, potentials of the bit lines BL1 to BLm and BLB1 to BLBm are controlled via the write circuit 35, so that the write data WD are written to the memory cell MC3.

Meanwhile, in the case of reading out the read data RD from the memory cells MC3, a read command CMR is inputted to the read control circuit 34, and an address AD is inputted to the row decoder 32. Upon input of the read command CMR to the read control circuit 34, the memory cells MC3 designated by the address AD are selected via the word lines WL1 to WLn. Upon selection of the memory cells MC3, the read data RD are read out from the memory cells M3 to be sent to the read circuit 33 via the bit lines BL1 to BLm and BLB1 to BLBm, and it is determined whether the read data RD are "0" or "1".

It is possible to test the bit lines BL1 to BLm by connecting the write circuit 35 to the bit lines BL1 to BLm at the side opposite to the read circuit 33 and making the test data TD to be sent from the write circuit 35 to the read circuit 33 via the bit lines BL1 to BLm. Therefore, it is unnecessary to make the read data RD to be read out from the memory cells MC3 or to provide a disconnection test register for each of the bit lines BL1 to BLm for testing the bit lines BL1 to BLm, thereby making it possible to shorten the test time while suppressing an increase in circuit size.

(Fourth Embodiment)

Figure 4:
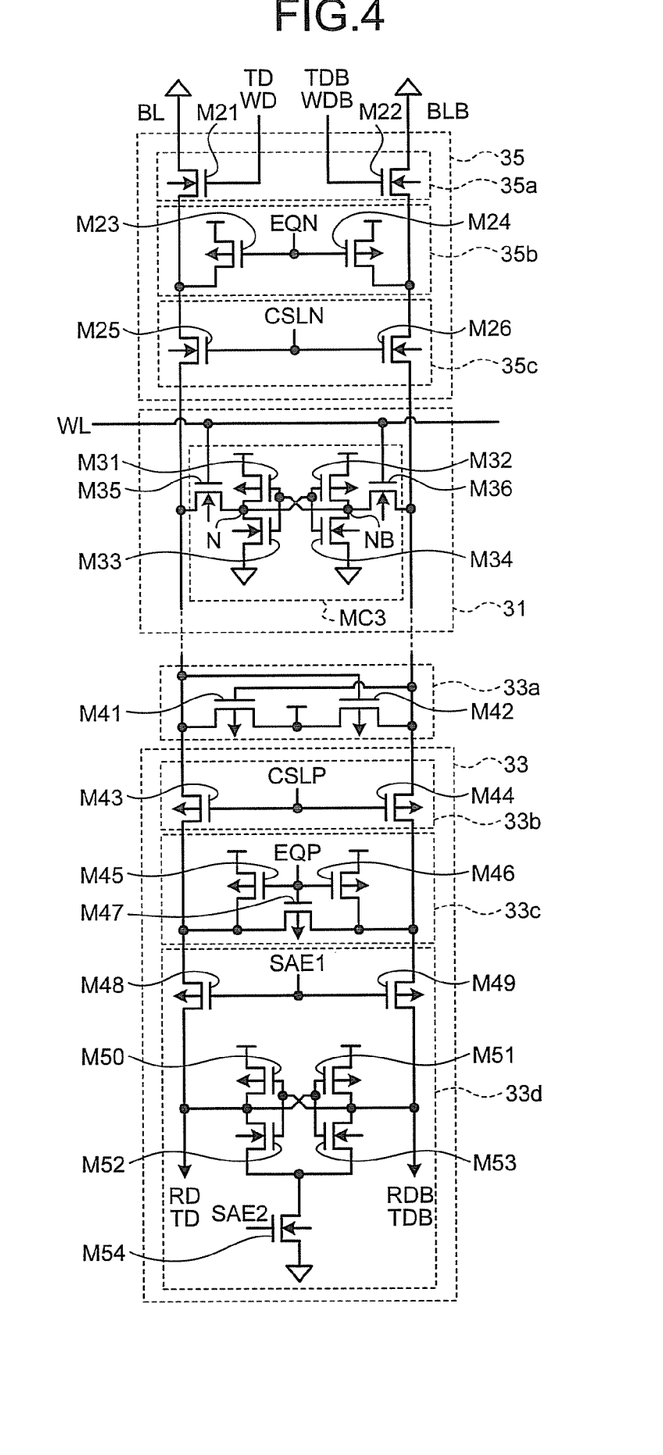
FIG. 4 is a block diagram illustrating a schematic configuration of a semiconductor memory according to a fourth embodiment of the present invention.

FIG. 4 is a block diagram illustrating a schematic configuration of a semiconductor memory according to the fourth embodiment of the present invention. The embodiment is one example adapting the present invention to an SRAM (static random access memory).

Referring to FIG. 4, in the semiconductor memory, field transistors M31 to M36 are provided as the memory cells MC3 of FIG. 3. A P-channel field effect transistor may be used as the field effect transistors M31 and M32, and an N-channel field effect transistor may be used as the field effect transistors M33 to M36.

The field effect transistor M31 and the field effect transistor M33 are serially connected, and a gate of the field effect transistor M31 and a gate of the field effect transistor M33 are connected to each other, thereby forming an inverter. The field effect transistor M32 and the field effect transistor M34 are serially connected, and a gate of the field effect transistor M32 and a gate of the field effect transistor M34 are connected to each other, thereby forming an inverter. An output of one of the pair of inverters is connected to an input of the other inverter, thereby forming a flip-flop.

The gate of the field effect transistor M31 and the gate of the field effect transistor M33 are connected to each other, and a drain of the field effect transistor M32 and a drain of the field effect transistor M34 are connected to each other, thereby forming a memory node NB which enables connection to the bit line BL via the field effect transistor M35. The gate of the field effect transistor M32 and the gate of the field effect transistor M34 are connected to each other, and a drain of the field effect transistor M31 and a drain of the field effect transistor M33 are connected to each other, thereby forming a memory node N which enables connection to the bit line BLB via the field effect transistor M36. The gate of the field effect transistor M35 and the gate of the field effect transistor M36 are connected to the word line WL. The memory nodes N and NB may complementarily retain data.

A read circuit 33 is provided with a column selection circuit 33b for performing column selection, an equalizer circuit 33c for averaging potentials between the bit lines BL and BLB, and a sense amplifier 33d for detecting whether data stored in memory cell MC3 are "0" or "1".

The column selection circuit 33b is provided with field effect transistors M43 and M44. A P-channel field effect transistor may be used as the field effect transistors M43 and M44. The field effect transistor M43 is inserted into the bit line BL, and the field effect transistor M44 is inserted into the bit line BLB. A column selection signal CSLP is inputted to gates of the field effect transistors M43 and M44.

The equalizer circuit 33c is provided with field effect transistors M45 to M47. A P-channel field effect transistor may be used as the field effect transistors M45 to M47. Gates of the field effect transistors M45 to M47 are connected to one another, and an equalizer signal EQP is inputted to the gates. The field effect transistor M47 is connected between the bit lines BL and BLB. A drain of the field effect transistor M45 is connected to the bit line BL, and a drain of the field effect transistor M46 is connected to the bit line BLB.

The sense amplifier 34d is provided with field effect transistors M48 to M54. A P-channel field effect transistor may be used as the field effect transistors M48 to M51, and an N-channel field effect transistor may be used as the field effect transistors M52 and M53.

A bit line potential stabilizer circuit 33a for stabilizing potentials of the bit lines BL and BLB is connected to the bit lines BL and BLB. The bit line potential stabilizer circuit 33a is provided with field effect transistors M41 and M42. A P-channel field effect transistor may be used as the field effect transistors M41 and M42. The field effect transistors M41 and M42 are serially connected to each other, and a source of the field effect transistor M41 and a gate of the field effect transistor M42 are connected to the bit line BL. A source of the field effect transistor M42 and the gate of the field effect transistor M41 are connected to the bit line BLB.

A field effect transistor M50 and a field effect transistor M52 are serially connected, and a gate of the field effect transistor M50 and a gate of the field effect transistor M52 are connected to each other, thereby forming an inverter. A field effect transistor M51 and a field effect transistor M53 are serially connected, and a gate of the field effect transistor M51 and a gate of the field effect transistor M53 are connected to each other, thereby forming an inverter. An output of one of the pair of inverters is connected to an input of the other inverter, thereby forming a flip-flop.

The gate of the field effect transistor M51, the gate of the field effect transistor M53, a drain of the field effect transistor M50, and a drain of the field effect transistor M52 are connected to the bit line BL. The gate of the field effect transistor M50, the gate of the field effect transistor M52, a drain of the field effect transistor M51, and a drain of the field effect transistor M53 are connected to the bit line BLB. Sources of the field effect transistors M52 and M53 are connected to the field effect transistor M54. A sense amplifier enable signal SAE2 is inputted to the gate of the field effect transistor M54.

The field effect transistor M48 is inserted into the bit line BL, and the field effect transistor M49 is inserted into the bit line BLB. A sense amplifier enable signal SAE1 is inputted to the gates of the field effect transistors M48 and M49.

A write circuit 35 is provided with a write data input circuit 35a for inputting write data WD and WDB and test data TD and TDB, an equalizer circuit 35b for averaging potentials between the bit lines BL and BLB, and a column selection circuit 35c for performing column selection.

The write data input circuit 35a is provided with field effect transistors M21 and M22. An N-channel field effect transistor may be used as the field effect transistors M21 and M22. The field effect transistor M21 is inserted into the bit line BL, and the field effect transistor M22 is inserted into the bit line BLB. The write data WD and the test data TD are inputted to a gate of the field effect transistor M21, and the write data WDB and the test data TDB are inputted to a gate of the field effect transistors M22.

The equalizer circuit 35b is provided with field effect transistors M23 and M24. A P-channel field effect transistor may be used as the field effect transistors M23 and M24. Gates of the field effect transistors M23 and M24 are connected to each other, and an equalizer signal EQN is inputted to the field effect transistors M23 and M24. A drain of the field effect transistor M23 is connected to the bit line BL, and a drain of the field effect transistor M24 is connected to the bit line BLB.

The column selection circuit 35c is provided with field effect transistors M25 and M26. An N-channel field effect transistor may be used as the field effect transistors M25 and M26. The field effect transistor M25 is inserted into the bit line BL, and the field effect transistor M26 is inserted into the bit line BLB. A column selection signal CSLN is inputted to gates of the field effect transistors M25 and M26.

For testing the bit lines BL and BLB, the column selection signal CSLN exhibits a high level to turn on the field effect transistors M25 and M26, and the column selection signal CSLP exhibits a low level to turn on the field effect transistors M43 and M44, so that the write data input circuit 35a and a sense amplifier 34d are connected via the bit lines BL and BLB.

The test data TD are inputted to the gate of the field effect transistor M21, and the test inverted data TDB are inputted to the field effect transistor M22, so that one of the field effect transistors M21 and M22 is turned on in response to the test data TD and the test inverted data TDB, thereby connecting one of the bit lines BL and BLB to a low level potential.

Upon connection of one of the bit lines BL and BLB to the low level potential, one of the field effect transistors M41 and M42 is turned on, and the other bit line EL or BLB is connected to a high level potential.

The potentials of the bit lines BL and BLB are inputted to the sense amplifier 33d when the sense amplifier enable signal SAE1 exhibits a low level, and, after that, the sense amplifier 33d is operated when the sense amplifier enable signal SAE1 exhibits a high level. The potentials of the bit lines BL and BLB are detected by the sense amplifier 33d, so that it is determined that the test data TD are "0" or "1".

Meanwhile, in the case of writing the write data WD to the memory cell MC3, the column selection signal CSLN exhibits a high level to turn on the field effect transistors M25 and M26, and the write data input circuit 35a and the memory cell MC3 are connected via the bit lines BL and BLB. The equalizer signal EQN exhibits a low level to turn on the field effect transistors M25 and M26, so that the bit lines BL and BLB are set to an identical potential.

The equalizer signal EQN exhibits a high level to turn off the field effect transistors M25 and M26, and, after that, the write data WD are inputted to the gate of the field effect transistor M21, and the write inverted data WDB are inputted to the gate of the field effect transistor M22, so that one of the field effect transistors M21 and M22 is turned on in response to the write data WD and the write inverted data WDB, thereby connecting one of the bit lines BL and BLB to a low level potential.

Upon connection of one of the bit lines BL and BLB to the low level potential, one of the field effect transistors M41 and M42 is turned on, and the other bit line EL or BLB is connected to a high level potential.

The memory cell MC3 designated by an address AD is selected via the word line WL. Upon selection of the memory cell MC3, data are complementarily retained by the memory nodes N and NB in response to the potentials of the bit lines BL and BLB, so that the write data WD are written to the memory cell MC3.

In the case of reading out the read data RD from the memory cell MC3, the column selection signal CSLP exhibits a low level to turn on the field effect transistors M43 and M44, so that the sense amplifier 33d and the memory cell MC3 are connected via the bit lines BL and BLB. The equalizer signal EQP exhibits a high level to turn on the field effect transistors M45 to M47, and the bit lines BL and BLB are set to an identical potential.

The equalizer signal EQP exhibits a low level to turn off the field effect transistors M45 to M47, and, after that, the memory cell MC3 designated by an address AD is selected via the word line WL. Upon selection of the memory cell MC3, potentials of the bit lines EL and BLB are changed in response to the data complementarily retained in the memory nodes N and NB.

The sense amplifier enable signal SAE1 exhibits a low level to make the potentials of the bit lines BL and BLB to be inputted to the sense amplifier 33d, and, after that, the sense amplifier enable signal SAE1 exhibits a high level to operate the sense amplifier 33d. The potentials of the bit lines BL and BLB are detected by the sense amplifier 33d, so that it is determined whether the read data RD are "0" or "1".

(Fifth Embodiment)

Figure 5:
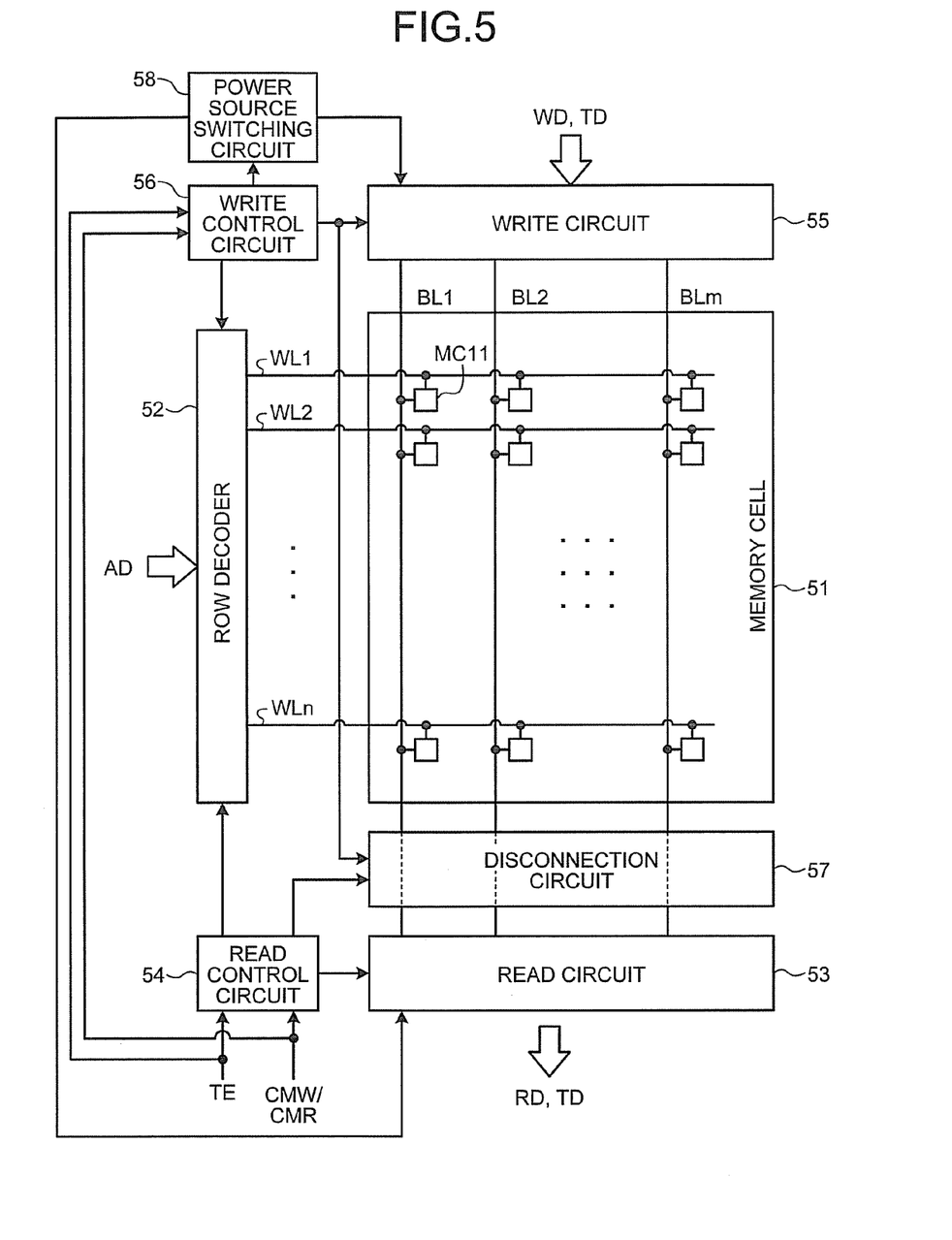
FIG. 5 is a block diagram illustrating a schematic configuration of a semiconductor memory according to a fifth embodiment of the present invention.

FIG. 5 is a block diagram illustrating a schematic configuration of a semiconductor memory according to the fifth embodiment of the present invention.

Referring to FIG. 5, the semiconductor memory is provided with a memory cell array 51, a row decoder 52, a read circuit 53, a read control circuit 54, a write circuit 55, a write control circuit 56, a disconnection circuit 57, and a power source switching circuit 58. In the memory cell array 51, memory cells MC11 for storing read data RD are arranged in matrix. The memory cells MC11 are capable of retaining data even when a power is turned off and forming a nonvolatile semiconductor memory such as an EEPROM and a flash memory, for example.

The memory cells MC11 of one row are commonly connected via one of word lines WL1 to WLn. The memory cells MC11 of one column are commonly connected via one of bit lines BL1 to BLm. In the memory cells MC11, a high voltage is supplied to the bit lines BL1 to BLm for data writing, and a low voltage is supplied to the bit lines BL1 to BLm for data reading.

The row decoder 52 is connected to one ends of the word lines WL1 to WLn. The row decoder 52 can select the memory cells MC11 in a row direction via the word lines WL1 to WLn designated by an address AD.

The write circuit 55 is connected to one ends of the bit lines BL1 to BLm. The write circuit 55 can write write data WD on the memory cell 11 via the bit line BL1 to BLm and sends test data TD to the bit lines BL to BLm.

The write control circuit 56 makes the test data TD to be sent from the write circuit 55 to the bit lines BL1 to BLm for test of the bit lines BL1 to BLm and making write data WD to be written to the memory cell MC11 from the write circuit 55 when writing the write data WD.

The read circuit 53 is connected to the other ends of the bit lines BL1 to BLm. The read circuit 53 can read out the read data RD from the memory cells MC11 via the bit lines BL1 to BLm and read out the test data TD sent from the write circuit 55 via the bit lines BL1 to BLm.

The read control circuit 54 makes the test data TD sent from the write circuit 55 via the bit lines BL1 to BLm to be read out when testing the bit lines BL1 to BLm and makes the read data RD to be read out from the memory cells MC11 when reading out the read data RD.

The power source switching circuit 58 is capable of switching a voltage of a power source of the write circuit 55 in such a manner that the high voltage is supplied to the bit lines BL1 to BLm for writing the write data WD to the memory cells MC11 and the low voltage is supplied to the bit lines BL1 to BLm for the test of the bit lines BL1 to BLm. The power source switching circuit 58 is capable of supplying a low voltage to the bit lines BL1 to BLm for reading out the read data RD from the memory cells MC11.

The disconnection circuit 57 is capable of connecting the write circuit 55 to the read circuit 53 via the bit lines BL1 to BLm for the test of the bit lines BL1 to BLm and disconnecting the write circuit 55 from the read circuit 53 for writing the write data WD to the memory cells MC11. Since a read circuit in an ordinary element structure serves as a circuit to enhance sensitivity, the read circuit has low voltage resistance. Therefore, since the read circuit cannot bear the high voltage for writing, the circuit for disconnecting the bit lines is required.

For the test of the bit lines BL1 to BLm, a test command TE is inputted to the read control circuit 54 and the write control circuit 56. Upon input of the test command TE to the read control circuit 54 and the write control circuit 56, the write control circuit 55 and the read control circuit 53 are connected via the bit lines BL1 to BLm in a state where the disconnection circuit 57 is in a connected state. The voltage of the power source of the write circuit 55 is switched in the power source switching circuit 58 in such a manner that the low voltage is supplied to the bit lines BL1 to BLm. The low voltage is a voltage that enables the BL test without breaking the read circuit. Though the low voltage may be varied depending on elements, a voltage of ½ or less of the write voltage is sufficient as the low voltage.

The test data TD are sent from the write circuit 55 via the bit lines BL1 to BLm and read out by the read circuit 33, whereby it is determined whether the test data TD are "0" or "1".

meanwile, in the case of writing the write data WD to the memory cells, a write command CMW is inputted to the write control circuit 56, and the address AD is inputted to the low decoder 52. When the write command CMW is inputted to the control circuit 56, the write circuit 55 and the read circuit 53 are disconnected by the disconnection circuit 57. The voltage of the power source of the write circuit 55 is switched by the power source switching circuit 58 in such a manner that a high voltage is supplied to the bit lines BL1 to BLm.

The memory cells MC11 designated by the address AD are selected via the word lines WL1 to WLn. Upon selection of the memory cells MC11, potentials of the bit lines BL1 to BLm are controlled via the write circuit 55 in response to the write data WD, so that the write data WD are written to the memory cells MC11.

Writing methods are various, and, in the case of injecting hot electrons generated at a drain into a floating gate, WL is set to a positive potential of a high voltage, and the drain is also set to a high voltage, so that hot electrons are generated when a drain current is supplied. The hot electrons are injected at the positive potential of the control gate to be stored as a charge.

Meanwhile, in the case of reading the read data Rd from the memory cells MC11, a read command CMR is inputted to the read control circuit 54, and an address AD is inputted to the row decoder 52. Upon input of the read command CMR to the read control circuit 54, the write circuit 55 and the read circuit 53 are connected via the bit lines BL1 to BLm by the disconnection circuit 57. Also, the voltage of the power source of the read circuit 53 is set by the power source switching circuit 58 so as to supply the low voltage to the bit lines BL1 to BLm.

Upon input of the read command CMR to the read control circuit 54, the memory cells MC11 designated by the address AD are selected via the word lines WL1 to WLn. Upon selection of the memory cells MC11, the read data RD are read out from the memory cells MC11 and sent to the read circuit 53 via the bit lines BL1 to BLm, so that it is determined whether the read data are "0" or "1".

It is possible to test the bit lines BL1 to BLm by connecting the write circuit 55 to the bit lines BL1 to BLm at the side opposite to the read circuit 53 and making the test data TD to be sent to the read circuit 53 via the bit lines BL1 to BLm from the write circuit 55. Therefore, it is unnecessary to make the read data RD to be read out from the memory cells MC11 or to provide a disconnection test register for each of the bit lines BL1 to BLm for testing the bit lines BL1 to BLm, thereby making it possible to shorten the test time while suppressing an increase in circuit size.

Also, in the case where a high voltage is applied to the bit lines BL1 to BLm via the write circuit 55 for writing the write data WD, it is possible to prevent the high voltage to be applied to the bit lines BL1 to BLm via the write circuit 55 during the test of the bit lines BL1 to BLm and to prevent break of the read circuit 53 by switching the voltage of the power source of the write circuit 55 between the writing of the write data WD and the test of the bit lines BL1 to BLm.

(Sixth Embodiment)

Figure 6:
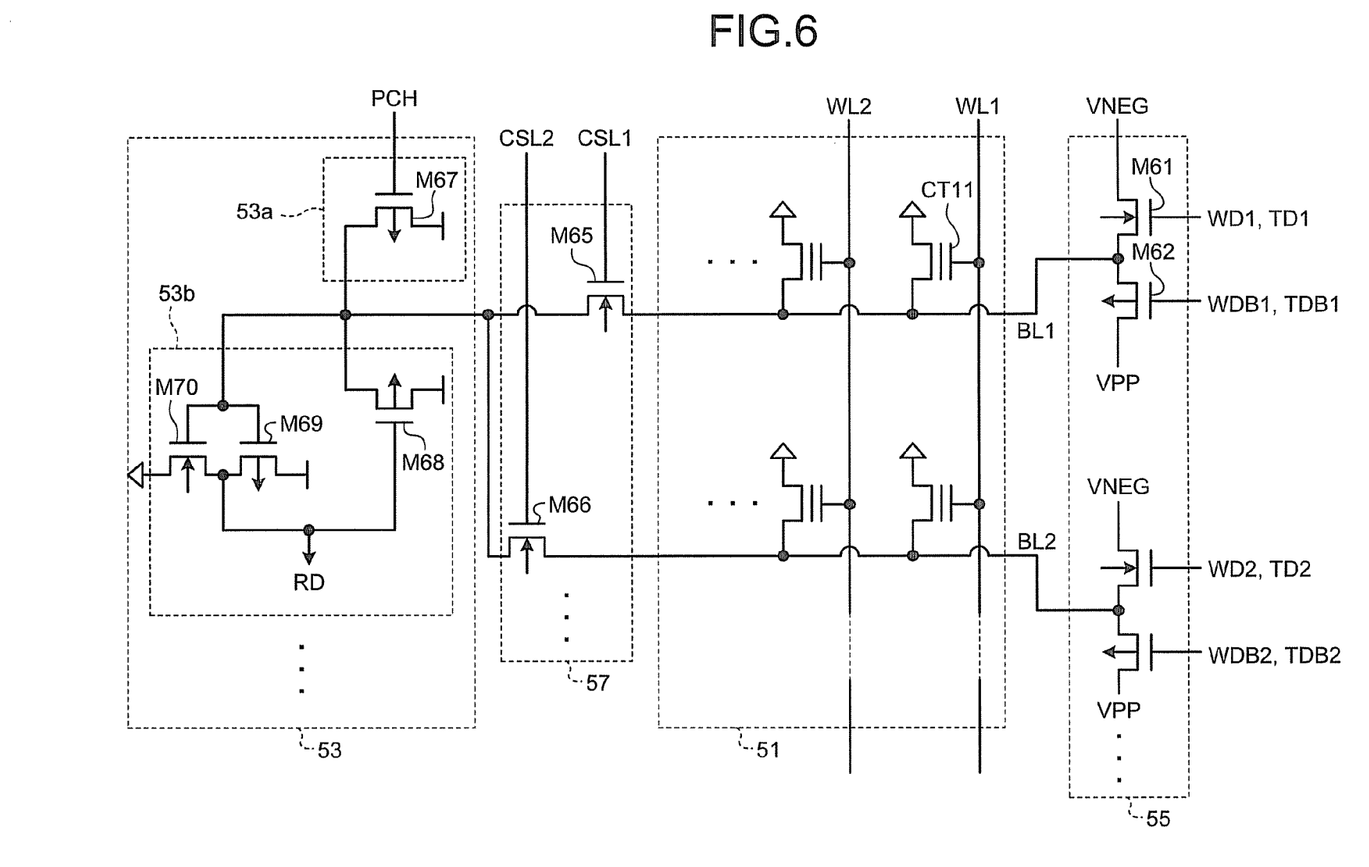
FIG. 6 is a block diagram illustrating a schematic configuration of a semiconductor memory according to a sixth embodiment of the present invention.

FIG. 6 is a block diagram illustrating a schematic configuration of a semiconductor memory according to the sixth embodiment of the present invention.

Referring to FIG. 6, in the semiconductor memory, a cell transistor CT 11 is provided as the memory cell MC11. In order to retain a charge in the cell transistor CT11, a MONOS structure or a floating gate structure may be provided.

Control gates of the cell transistors CT11 of one row are commonly connected to one of word lines WL1, WL2, and the like. Drains of the cell transistors CT11 of one row are commonly connected to one of bit lines BL1, BL2, and the like.

A read circuit 53 is provided with a precharge circuit 53a for precharging the bit lines BL1, BL2, and the like and a sense amplifier circuit 53b for detecting whether the data stored in the memory cells MC11 are "0" or "1".

In the precharge circuit 53a, a field effect transistor M67 is provided for each of pairs of adjacent two columns. A drain of the field effect transistor M67 for adjacent two columns is connected to the bit lines BL1 and BL2 and the like. A precharge signal PCH is inputted to the gate of the field effect transistor M67.

In the sense amplifier circuit 53b, field effect transistors M68 to M70 are provided for each of pairs of adjacent two columns. The field effect transistors M69 and M70 are serially connected to each other to form an inverter, and gates of the field effect transistors M69 and M70 for adjacent two columns are commonly connected to the bit lines BL1 and BL2 and the like.

Drains of the field effect transistors M69 and M70 are connected to a gate of the field effect transistor M68, and a drain of the field effect transistor M68 for adjacent two columns is connected to the bit lines BL1 and BL2 and the like.

In a disconnection circuit 57, field effect transistors M65 and M66 are provided for each of pairs of adjacent two columns. The field effect transistors M66 are inserted into even-numbered bit lines BL2, BL4, and the like, and the field effect transistors M65 are inserted into the odd-numbered bit lines BL1, BL3, and the like. A column selection signal CSL1 is inputted to gates of the field effect transistors M65, and a column selection signal CSL2 is inputted to gates of the fielded effect transistors M66.

In a write circuit 55, field effect transistors M61 and M62 are provided for each of the columns. The field effect transistors M61 and M62 are connected serially to each other, and drains of the field effect transistors M61 and M62 are connected to the bit lines BL1, BL2, and the like.

A program voltage VPP is supplied to sources of the field effect transistors M62, and a negative voltage VNEG is supplied to sources of the field effect transistors M61. Write data WD1, WD2, and the like and test data TD1, TD2, and the like are inputted to gates of the field effect transistors M61, and write inverted data WDB1, WEB2, and the like and test inverted data TDB1, TDB2, and the like are inputted to gates of the field effect transistors M62.

A P-channel field effect transistor may be used as the field effect transistors M62 and M67 to M69, and an N-channel field effect transistor may be used as the field effect transistors M61, M65, M66, and M70.

For testing the bit lines BL1, BL2, and the like, the column selection signals CSL1 and CSL2 exhibit a high level to turn on the field effect transistors M65 and M66, and the write circuit 55 and the read circuit 53 are connected via the bit lines BL1 to BLm. The program voltage VPP is switched in such a manner that a low voltage is supplied to the bit lines BL1, BL2, and the like.

The test inverted data TDB1, TDB2, and the like are inputted to the gates of the field effect transistors M62 to turn on the field effect transistors M62 in response to the test inverted data TDB1, TDB2, and the like, so that the program voltage VPP is applied to the bit lines BL1, BL2, and the like.

Potentials of the bit lines BL1 to BLm are detected by the read circuit 53, so that it is determined whether the test inverted data TDB1, TDB2, and the like are "0" or "1".

Meanwhile, in the case of writing write inverted data WDB1, WDB2, and the like to the memory cells MC11, the column selection signals CSL1 and CSL2 exhibit a low level to turn off the field effect transistors M65 ad M66, so that the write circuit 55 and the read circuit 53 are disconnected from each other. Also, the program voltage VPP is switched in such a manner that a high voltage is supplied to the bit lines BL1, BL2, and the like.

The write inverted data WDB1, WDB2, and the like are inputted to the gates of the field effect transistors M62 to turn on the field effect transistors M62 in response to the write inverted data WDB1, WDB2, and the like, so that the program voltage VPP is applied to the bit lines BL1, BL2, and the like.

The memory cells MC11 designated by an address AD are selected via the word lines WL1 to WLN. Upon selection of the memory cells MC11, a charge is injected into the cell transistors CT11 in response to the potential of the bit lines BL1 to BLm, so that the write inverted data WDB1, WDB2, and the like are written to the memory cells MC11.

Meanwhile, in the case of reading the read data RD from the memory cells MC11, the column selection signals CSL1 and CSL2 exhibit a high level to turn on the field effect transistors M65 and M66, so that the write circuit 55 and the read circuit 53 are connected via the bit lines BL1 to BLm.

The precharge signal PCH exhibits a low level to turn on the field effect transistors M67, so that the bit lines BL1, BL2, and the like are precharged to a high level potential.

A read potential is applied to control gates of the cell transistors CT11 via the word lines WL1, WL2, and the like designated by the address AD, and the cell transistors CT11 are turned on when the data stored in the memory cells MC11 are "0". When the cell transistors CT11 are turned on, the bit lines BL1, BL2, and the like are connected to a low level potential, so that the potential of the bit lines BL1, BL2, and the like transit to the low level potential.

When the low level potential of the bit lines BL1 to BLm is detected by the read circuit 53, the read data RD read out from the memory cells MC11 are determined to be "0".

Meanwhile, in the case where the data stored in the memory cells MC11 are "1", the cell transistors CT11 are turned off even when the read potential is applied to the control gates of the cell transistors CT11. When the cell transistors CT11 are turned off, the potential of the bit lines BL1, BL2, and the like maintains the high level.

When the high level potential of the bit lines BL1 to BLm is detected by the read circuit 53, the read data RD read out from the memory cells MC11 are determined to be "1".

(Seventh Embodiment)

Figure 7:
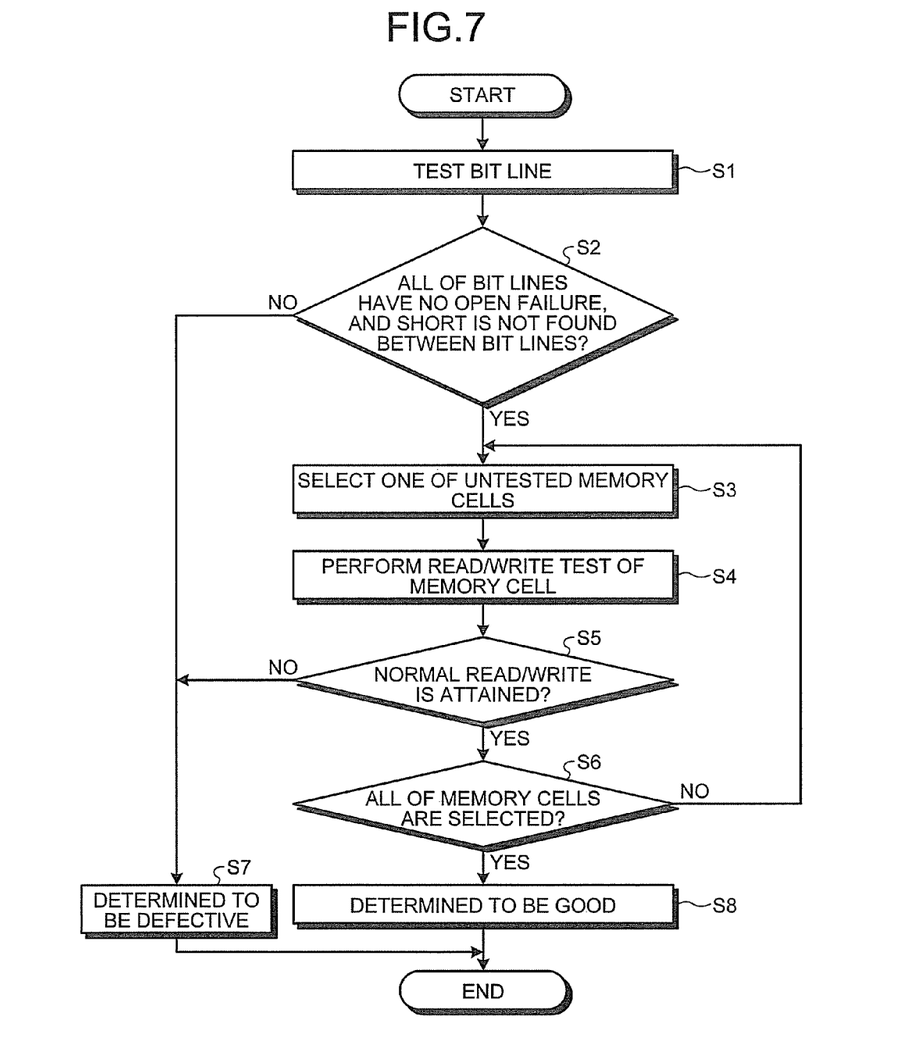
FIG. 7 is a flowchart illustrating a semiconductor memory test method according to a seventh embodiment of the present invention.

FIG. 7 is a flowchart illustrating a semiconductor memory test method according to the seventh embodiment of the present invention.

Referring to FIG. 7, in the case of performing a test of the semiconductor memory, bit lines are tested (Step Si) In the bit line test, test data are sent from one end of the bit line commonly connected to memory cells of one column, and the test data are read out from the other end of the bit line, so that it is possible to test an open failure of all of the bit lines and a short failure between each of pairs of adjacent bit lines. For example, in the case where the test data sent from the one end of the bit line are "0" and the test data read out from the other end of the bit line are "1", the bit line has the open failure. In the case where test data sent from one ends of the pair of bit lines adjacent to each other are different from each other and the test data read out from the other ends of the pair of bit lines are identical with each other, it is determined that the short failure is generated between the pair of bit lines.

In the case where there is the open failure of bit line or the short failure between the adjacent bit lines (Step S2), it is judged that the semiconductor memory is defective (Step S7).

In the case where there is no open failure in all of the bit lines and there is no short failure in each of pairs of adjacent bit lines, one of untested memory cells is selected (Step S3), and a read/write test of the memory cell is performed (Step S4).

In the case where the normal read/write is not attained in the memory cell (Step S5), it is determined that the semiconductor memory is defective (Step S7).

In the case where the normal read/write is attained in the memory cell, the memory cells are selected one by one until no untested memory cell remains, and each of the selected memory cells is subjected to the read/write test (Step S6).

In the case where the normal read/write is attained in all of the memory cells, it is determined that the semiconductor memory is good (Step S8). As the read/write of the memory cells, a marching pattern test may be employed.

Thus, since it is possible to perform the read/write test on the memory cells only of the semiconductor memory that is free from the failures of bit lines, the necessity of performing the read/write test on memory cells of a semiconductor memory that has the failures of bit lines is eliminated, thereby shortening the semiconductor memory test time.

The numbers of columns and rows are limited in some of the above-described embodiments, but the present invention is not limited to such cases and can be adapted to an arbitrary structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
    a memory cell array in which memory cells are arranged in matrix;
    a word line commonly connected to memory cells for each of rows;
    a bit line commonly connected to memory cells for each of columns;
    a write circuit connected to one ends of the bit lines configured to write data to the memory cells via the bit lines;
    a read circuit connected to the other ends of the bit lines configured to read data from the memory cells via the bit lines;
    a write control circuit configured to make test data to be sent from the write circuit to the bit lines for testing the bit lines and configured to make data to be written from the write circuit to the memory cells for data writing; and
    a read control circuit configured to make the test data sent to the bit lines to be read out when testing the bit lines and configured to make the data stored in the memory cells to be read out by the read circuit when reading out the data, wherein the word line is inactivated during testing the bit lines.

2. The semiconductor memory according to claim 1, wherein the write circuit and the read circuit are capable of simultaneous operation for testing the bit lines.

3. The semiconductor memory according to claim 1, wherein each of the memory cells is an SRAM.

4. The semiconductor memory according to claim 1, further comprising:
    a power source switching circuit configured to switch a voltage of a power source of the write circuit in such a manner that a high voltage is supplied to the bit lines for writing the data to the memory cells and a low voltage is supplied to the bit lines for testing the bit lines; and
    a disconnection circuit configured to connect the write circuit and the read circuit to each other via the bit lines for testing the bit lines and disconnect the write circuit and the read circuit from each other for the data writing to the memory cells.

5. The semiconductor memory according to claim 4, wherein each of the memory cells is an EEPROM or a flash memory.

6. The semiconductor memory according to claim 1, wherein it is determined that the bit line has an open failure in the case where the test data sent from one end of the bit line are "0" and the test data read out from the other end of the bit line are "1".

7. The semiconductor memory according to claim 1, wherein, in the case where the test data sent from one ends of a pair of bit lines adjacent to each other are different from each other and the test data read out from the other ends of the pair of bit lines are identical with each other, it is determined that a short failure is generated between the bit lines.

* * * * *